(12) United States Patent
Liu et al.

(10) Patent No.: US 11,901,463 B2
(45) Date of Patent: Feb. 13, 2024

(54) METHOD OF MAKING DECOUPLING CAPACITOR

(71) Applicant: TAIWAN SEMICONDUCTOR MANUFACTURING COMPANY, LTD., Hsinchu (TW)

(72) Inventors: Szu-Lin Liu, Hsinchu (TW); Jaw-Juinn Horng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/850,636

(22) Filed: Jun. 27, 2022

(65) Prior Publication Data
US 2022/0336683 A1 Oct. 20, 2022

Related U.S. Application Data

(62) Division of application No. 16/573,725, filed on Sep. 17, 2019, now Pat. No. 11,515,434.

(51) Int. Cl.
*H01L 21/265* (2006.01)
*H01L 29/66* (2006.01)
(Continued)

(52) U.S. Cl.
CPC .......... *H01L 29/94* (2013.01); *H01L 29/0607* (2013.01); *H01L 29/66181* (2013.01)

(58) Field of Classification Search
CPC ........... H01L 21/26513; H01L 29/0607; H01L 29/0684; H01L 29/0847; H01L 29/1033;
(Continued)

(56) References Cited

U.S. PATENT DOCUMENTS 6,100,770 A * 8/2000 Litwin .................... H01L 29/94
257/E29.345
6,285,052 B1 * 9/2001 Draper ................ H01L 27/0811
257/E29.345
(Continued)

FOREIGN PATENT DOCUMENTS

CN 101005070 7/2007
CN 103208535 7/2013
(Continued)

OTHER PUBLICATIONS

Office Action dated Apr. 6, 2021 for corresponding case No. TW 11020309020. (pp. 1-10).

*Primary Examiner* — Omar F Mojaddedi
(74) *Attorney, Agent, or Firm* — Hauptman Ham, LLP

(57) ABSTRACT

A method includes implanting a first dopant having a first dopant type into a substrate to define a plurality of source/drain (S/D) regions. The method further includes implanting a second dopant having the first dopant type into the substrate to define a channel region between adjacent S/D regions of the plurality of S/D regions, wherein a dopant concentration of the second dopant in the channel region is less than half of a dopant concentration of the first dopant in each of the plurality of S/D regions. The method further includes forming a gate stack over the channel region. The method further includes electrically coupling each of the plurality of S/D regions together.

20 Claims, 12 Drawing Sheets

(51) Int. Cl.
*H01L 29/93* (2006.01)
*H01L 27/08* (2006.01)
*H01L 29/94* (2006.01)
*H01L 29/06* (2006.01)

(58) Field of Classification Search
CPC ......... H01L 29/66181; H01L 29/66477; H01L 29/66174; H01L 29/78; H01L 29/93; H01L 29/94; H01L 27/0808
See application file for complete search history.

(56) References Cited

U.S. PATENT DOCUMENTS

| | | | |
|---|---|---|---|
| 6,999,296 | B2 * | 2/2006 | Kurosawa ........... H01L 27/0808 361/278 |
| 2002/0074589 | A1 * | 6/2002 | Benaissa ................. H01L 29/94 257/E29.345 |
| 2003/0001206 | A1 | 1/2003 | Negoro et al. |
| 2006/0006431 | A1 * | 1/2006 | Jean ....................... H01L 29/93 257/E29.345 |
| 2008/0079116 | A1 | 4/2008 | Yuan et al. |
| 2009/0273029 | A1 | 11/2009 | Tien et al. |
| 2012/0187494 | A1 * | 7/2012 | Huang .............. H01L 29/66174 257/E27.06 |
| 2013/0181269 | A1 | 7/2013 | Chen |
| 2016/0093750 | A1 * | 3/2016 | Kim ........................ H01L 29/94 257/595 |
| 2017/0084736 | A1 | 3/2017 | Toh et al. |
| 2018/0076194 | A1 * | 3/2018 | Chen .................... H01L 29/7833 |
| 2019/0288112 | A1 | 9/2019 | Wang et al. |

FOREIGN PATENT DOCUMENTS

| | | |
|---|---|---|
| TW | 200405523 A | 4/2004 |
| TW | 200535931 A | 11/2005 |
| TW | 201426972 A | 7/2014 |
| TW | 201911571 A | 3/2019 |

* cited by examiner

METHOD OF MAKING DECOUPLING CAPACITOR

RELATED APPLICATION

This application is a divisional of U.S. patent application Ser. No. 16/573,725, filed Sep. 17, 2019, which is hereby incorporated by reference in its entirety.

BACKGROUND

Power supply noise, simultaneous switching noise, or dynamic switching noise, is an increasing concern as technology nodes continue to shrink. The noise results from switching noise on the power supply lines that are coupled from other signal nodes.

Decoupling capacitors are used to filter out noise coupling between a positive supply voltage and a lower supply voltage. In some instances, such power noises are induced by transistors in a high density IC utilizing a large current and having a high frequency, which results in abrupt voltage drops. There can be both global and localized voltage drops on the power grid of the IC. In some approaches, this voltage drop is reduced by introducing localized current sources, such as capacitors, to decouple current surges from the power grid, and thereby reduce noise on the power grid.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
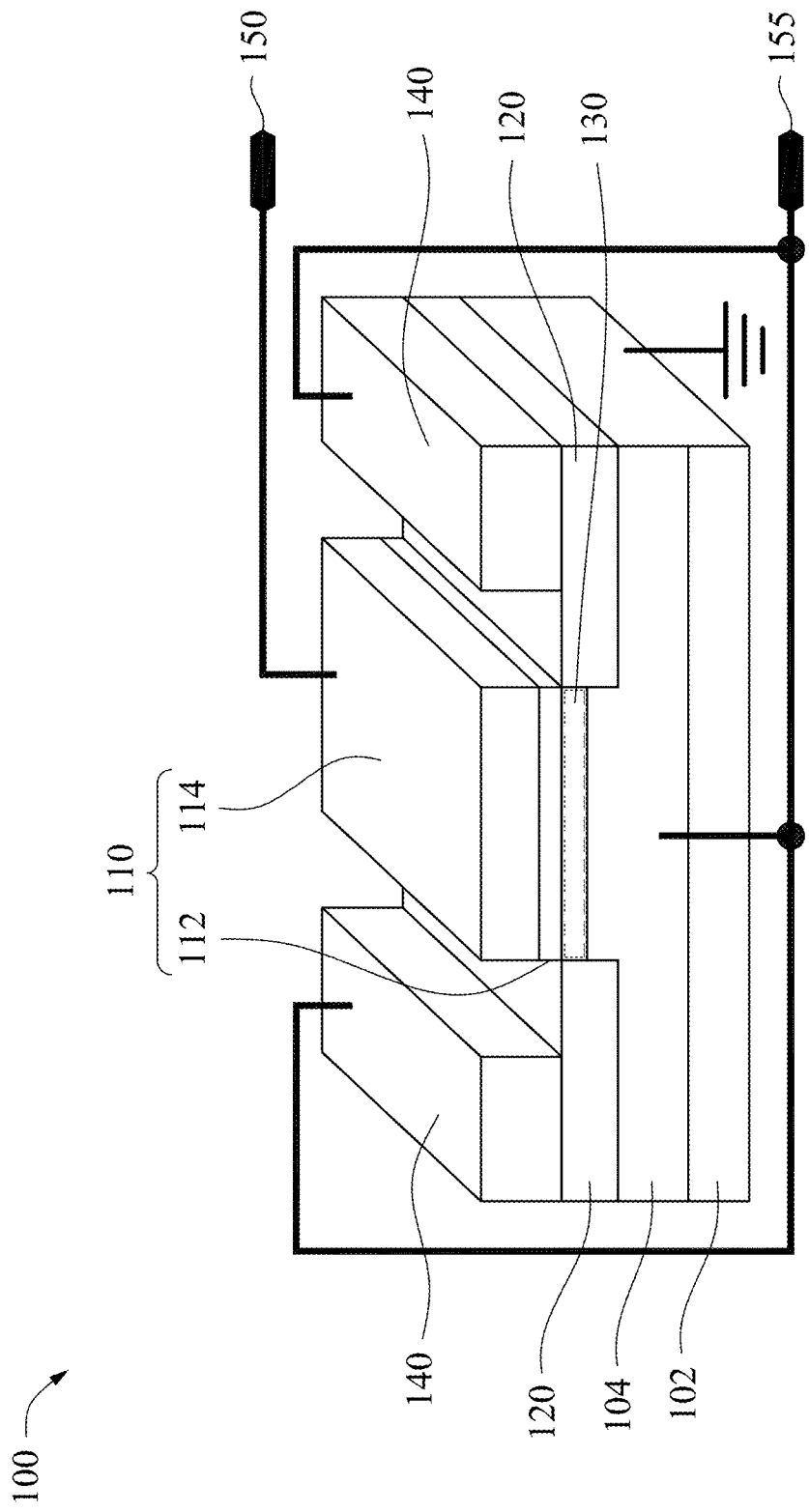
FIG. 1 is a perspective view of a p-type metal oxide semiconductor (PMOS) decoupling capacitor in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As technology nodes continue to shrink and integrated circuits (ICs) are incorporated into more portable devices, size and power consumption are focuses of improving ICs. Decreasing a size of decoupling capacitors helps to increase the number of elements per unit area in the IC. However, decreasing the size of the decoupling capacitor also introduces processing concerns related to reliability and manufacturing yield.

In some approaches, conductive gates or conductive contacts are formed over shallow trench isolation (STI) features in a substrate in order to form a decoupling capacitor. Shrinking technology nodes reduces the size of the STI features, which creates processing concerns for reliably forming the conductive gate or contacts on the STI features. This increases the risk of manufacturing error, lowering manufacturing yield.

In some approaches, metal-oxide-metal (MOM) capacitors are formed in an interconnect structure in order to act as decoupling capacitors. MOM capacitors occupy portions of a power/ground (P/G) area in the interconnect structure for routing conductive lines for transferring supply voltages and reference voltages to elements in the IC. As technology nodes shrink, an amount of P/G area interconnect structure available for MOM capacitors decreases. As a result, MOM capacitors are not usable in some situations which do not have available P/G areas in the IC design.

In some approaches, decoupling capacitors utilizing deep n-well (DNW) structures are formed in a core area of the IC. A core area of an element is an area in which functionality of the element is achieved. The core area is surrounded by an input-output (IO) area; and the core area uses a lower supply voltage than the IO area. The IO area is used to transfer signal in and out of the core area to other elements within the IC for implementing the overall functionality of the IC. This type of decoupling capacitor is called an accumulation decoupling capacitor in some instances. The formation the DNW in the accumulation decoupling capacitor adds an extra step in a manufacturing process, which in turn utilizes an extra mask for production of the accumulation decoupling capacitor. The extra mask and production step increases manufacturing time, cost and variation.

In some approaches, core area decoupling capacitors do not include the DNW but have a different dopant type in a channel region than in the source/drain (S/D) regions. This type of decoupling capacitor experiences a high gate leakage issue. The high gate leakage means that the decoupling capacitor has a higher amount of current flowing through the structure even when the device is not activated. As leakage increases, power consumption also increases. In some instances, a larger battery is used to offset the increased power consumption for these decoupling capacitors. However, the larger battery increases the size of the overall device without increasing a battery life duration for operating the device.

In contrast to the approaches above, the structure of embodiments of the current disclosure utilizes a channel region having a same dopant type as the S/D regions or a lightly doped drain (LDD) region. This structure helps to minimize the size of the decoupling capacitor while also maximizing power efficiency and manufacturing yield.

FIG. 1 is a perspective view of a p-type metal oxide semiconductor (PMOS) decoupling capacitor 100 in accordance with some embodiments. PMOS decoupling capacitor 100 includes a substrate 102. In some embodiments, the substrate 102 is a p-doped substrate. An n-well 104 is within the substrate 102 over a base portion of the substrate 102. A gate structure 110 is over the substrate 102. The gate structure 110 includes a gate dielectric 112 and a gate electrode 114. PMOS decoupling capacitor 100 further includes source/drain (S/D) regions 120. S/D regions 120 are in substrate 102. In some embodiments, S/D regions 120 extend above the substrate 102. S/D regions 120 have a p-type dopant. A channel region 130 is defined between the S/D regions 120 and under gate structure 110. The channel region 130 has a p-type dopant. A concentration of dopants in the channel region 130 is less than a concentration of dopants in the S/D regions 120. Contacts 140 are over S/D regions 120 in order to provide electrically connection to the S/D regions 120. Terminal 150 is electrically connected to gate structure 110. Terminal 155 is electrically connected to contacts 140 and to n-well 104. Terminals 150 and 155 electrically connect PMOS decoupling capacitor 100 to other elements within an IC. In some embodiments, a supply voltage, e.g., VDD, is electrically connected to at least one of the terminals 150 or 155. The substrate 102 is electrically connected to a reference voltage, e.g., a ground voltage.

In some embodiments, substrate 102 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

The n-well 104 is in the substrate 102; and includes a portion extending upward between the S/D regions 120. In some embodiments, the n-well 104 is formed by an ion implantation process. In some embodiments, the n-well 104 is formed using a blanket implantation process. In some embodiments, the n-well 104 is formed using a targeted implantation process. For example, the n-well 104 is formed by growing a sacrificial oxide on the substrate, 102, opening a pattern for the location of the n-well 104 and then using a chained-implantation procedure to introduce n-type dopants into the substrate 102. In some embodiments, n-well 104 is formed using an epitaxial process where the epi-material is doped either following the epitaxial process or in-situ during the epitaxial process. In some embodiments, the n-type dopants include arsenic and/or phosphorous or another suitable material.

The gate structure 110 is over the substrate 102 and over the channel region 130. The gate structure 110 includes the gate dielectric 112. In some embodiments, an interfacial layer is between the gate dielectric 112 and the substrate 102. According to some embodiments, gate dielectric layer 320 includes silicon dioxide ($SiO_2$), silicon oxy-nitride (SiON), or some other appropriate gate dielectric material for FETs. In some embodiments, the gate dielectric 112 is a high-k ($\kappa$—dielectric constant) dielectric material with a dielectric constant greater than that of silicon dioxide ($\kappa=3.9$). In some embodiments, the gate dielectric 112 is a dielectric including HfZrO, $HfSiO_4$, $TiO_2$, $Ta_2O_3$, $ZrO_2$, $ZrSiO_2$, or combinations thereof, or other suitable materials. In some embodiments, the gate dielectric 112 is formed by deposition methods such as atomic layer deposition or epitaxial film growth in order to produce a film of substantially uniform thickness.

The gate electrode 114 is over the gate dielectric 112. In some embodiments, the gate electrode 114 includes a metallic material or another suitable conductive material. In some embodiments, the gate electrode 114 includes silicon or doped silicon. In some embodiments, the gate electrode 114 directly contacts the gate dielectric 112. In some embodiments, the gate electrode 114 is separated from the gate dielectric 112 by another layer, such as a diffusion barrier layer. In some embodiments, the gate electrode 114 is formed using a deposition process such as physical vapor deposition (PVD), atomic layer deposition (ALD), plating or another suitable deposition process.

The S/D regions 120 are on opposite sides of the channel region 130. The S/D regions 120 include a p-type dopant. In some embodiments, the p-type dopant includes boron, boron nitride, or another suitable p-type dopant. In some embodiments, a concentration of dopants in S/D regions 120 ranges from about $1e19$ $cm^{-3}$ to about $1e21$ $cm^{-3}$. In some instances, if the dopant concentration in the S/D regions 120 is too high, a risk of leakage current in PMOS decoupling capacitor 100 increases to an unacceptable level. In some instances, if the dopant concentration in the S/D regions 120 is too low, a resistance of the PMOS decoupling capacitor 100 increases to an unacceptable level.

The channel region 130 is between the S/D regions 120 and below the gate structure 110. The channel region 130 includes a p-type dopant. In some embodiments, the p-type dopant includes boron, boron nitride, or another suitable p-type dopant. In some embodiments, the channel region 130 has a different species of p-type dopant than the S/D regions 120. In some embodiments, the channel region 130 has a same species of p-type dopant as the S/D regions 120. The concentration of p-type dopants in the channel region 130 is less than the concentration of p-type dopants in the S/D regions 120. In some embodiments, a concentration of p-type dopants in the channel region 130 is less than half of the concentration of p-type dopants in the S/D regions. In some embodiments, the concentration of p-type dopants in the channel region 130 ranges from about 5e16 cm$^{-3}$ to about 1e18 cm$^{-3}$. In some instances, if the dopant concentration in the channel region 130 is too high, a risk of leakage current in PMOS decoupling capacitor 100 increases to an unacceptable level. In some instances, if the dopant concentration in the channel region 130 is too low, a capacitance of the PMOS decoupling capacitor 100 is reduced to an unacceptable level.

Contacts 140 are over S/D regions 120 in order to provide electrically connection between the S/D regions 120 and other elements of the IC. The contacts 140 reduce the resistance for the electrically connection with S/D regions 120. In some embodiments, the contacts 140 include gold, copper, aluminum, tungsten, cobalt or another suitable conductive material. In some embodiments, the contacts are formed using a PVD, ALD, chemical vapor deposition (CVD), plating or another suitable process.

Terminals 150 and 155 are configured to receive voltage signals for PMOS decoupling capacitor 100. The terminal 150 is configured to receive a first voltage signal different from a second voltage signal received at the terminal 155. The terminal 150 is electrically connected to the gate electrode 114. The terminal 155 is electrically connected to contacts 140 and n-well 104. The gate dielectric 112 acts as the insulator between the two different conductive elements receiving voltage signals. The substrate 102 is connected to a reference voltage, e.g., a ground voltage.

In comparison with other devices, PMOS decoupling capacitor 100 has an increased capacitance for small supply voltages. In addition, since PMOS decoupling capacitor 100 does not include a DNW, a number of masks used to form decoupling capacitor 100 is reduced in comparison with other structures. As a result, the cost of manufacturing decoupling capacitor 100 is less than other structures. PMOS decoupling capacitor 100 exhibits a leakage current that is about 10% of the leakage current for an inversion bias decoupling capacitor of similar size. Further, a size of PMOS decoupling capacitor 100 is able to be reduced by about 10% in comparison with other structures that do not include a same dopant type in the channel region as in the S/D regions.

Figure 2:
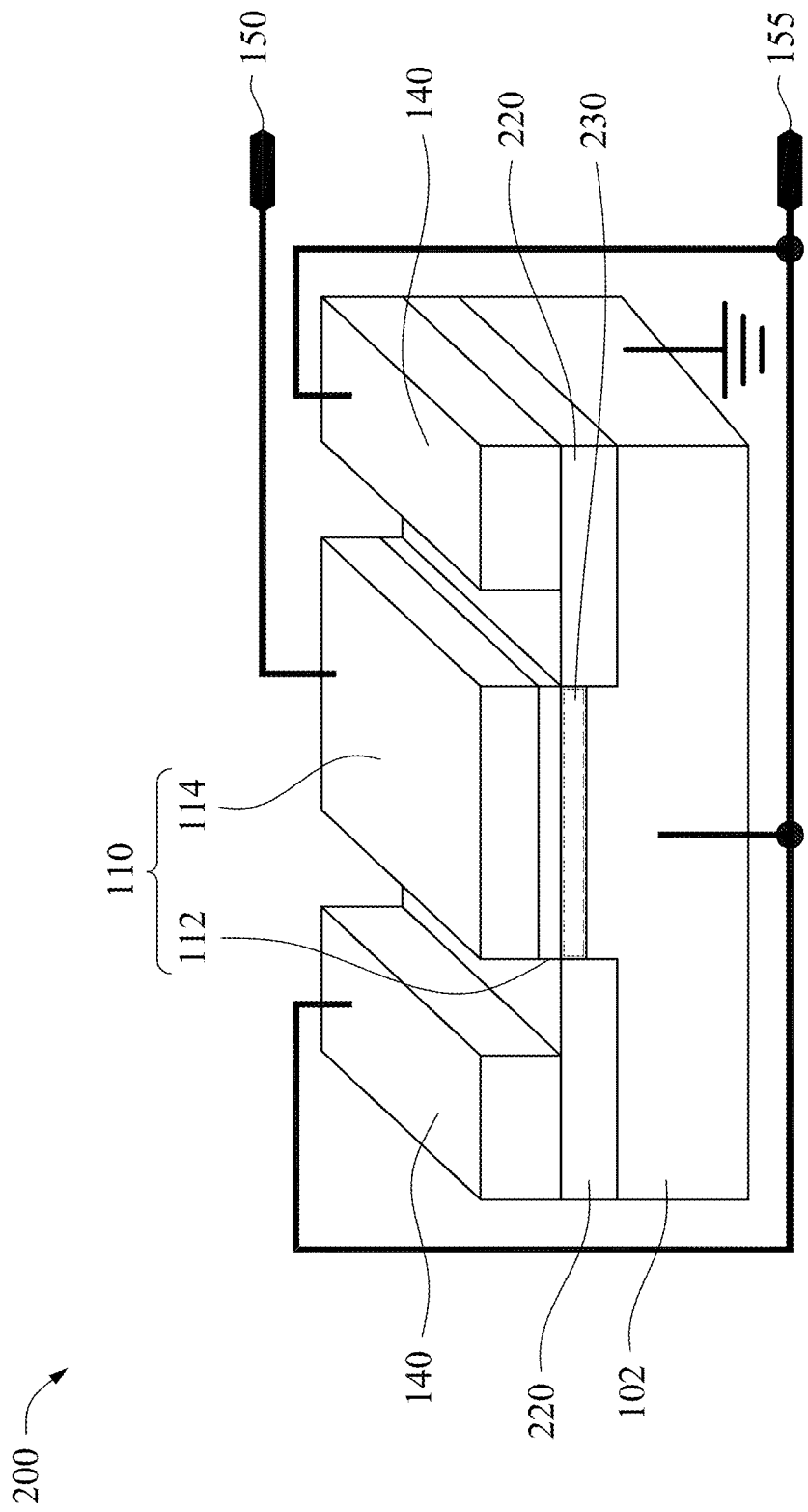
FIG. 2 is a perspective view of an n-type metal oxide semiconductor (NMOS) decoupling capacitor in accordance with some embodiments.

FIG. 2 is a perspective view of an n-type metal oxide semiconductor (NMOS) decoupling capacitor 200 in accordance with some embodiments. NMOS decoupling capacitor 200 is able to achieve similar performance and size reduction as PMOS decoupling capacitor 100. Elements in NMOS decoupling capacitor 200 that are the same as elements in PMOS decoupling capacitor 100 have a same reference number. In comparison with PMOS decoupling capacitor 100, NMOS decoupling capacitor 200 does not include n-well 104. Also, NMOS decoupling capacitor 200 includes n-type dopants in S/D regions 220 and in channel region 230.

The S/D regions 220 are on opposite sides of the channel region 230. The S/D regions 220 include an n-type dopant. In some embodiments, the n-type dopant includes arsenic, phosphorous, or another suitable n-type dopant. In some embodiments, a concentration of dopants in S/D regions 220 ranges from about 1e19 cm$^{-3}$ to about 1e21 cm$^{-3}$. In some instances, if the dopant concentration in the S/D regions 220 is too high, a risk of leakage current in NMOS decoupling capacitor 200 increases to an unacceptable level. In some instances, if the dopant concentration in the S/D regions 220 is too low, a resistance of the NMOS decoupling capacitor 200 increases to an unacceptable level.

The channel region 230 is between the S/D regions 220 and below the gate structure 110. The channel region 230 includes an n-type dopant. In some embodiments, the n-type dopant includes arsenic, phosphorous, or another suitable p-type dopant. In some embodiments, the channel region 230 has a different species of n-type dopant than the S/D regions 220. In some embodiments, the channel region 230 has a same species of n-type dopant as the S/D regions 220. The concentration of n-type dopants in the channel region 230 is less than the concentration of n-type dopants in the S/D regions 220. In some embodiments, a concentration of n-type dopants in the channel region 230 is less than half of the concentration of n-type dopants in the S/D regions 220. In some embodiments, the concentration of n-type dopants in the channel region 230 ranges from about 5e16 cm$^{-3}$ to about 1e18 cm$^{-3}$. In some instances, if the dopant concentration in the channel region 230 is too high, a risk of leakage current in NMOS decoupling capacitor 200 increases to an unacceptable level. In some instances, if the dopant concentration in the channel region 230 is too low, a capacitance of the NMOS decoupling capacitor 200 is reduced to an unacceptable level.

Figure 3:
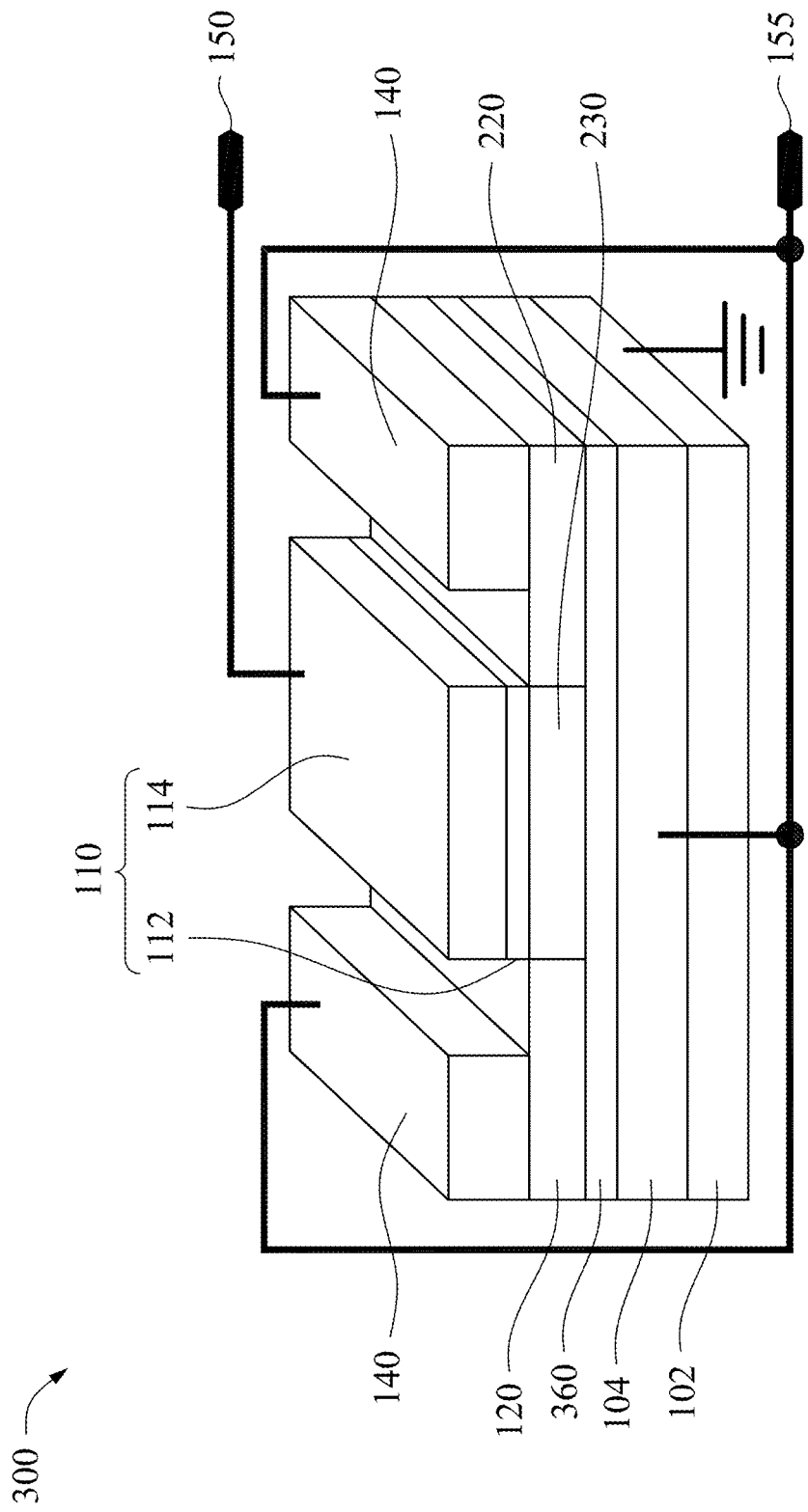
FIG. 3 is a perspective view of a p-type metal oxide semiconductor (PMOS) decoupling capacitor in accordance with some embodiments.

FIG. 3 is a perspective view of an n-type metal oxide semiconductor (NMOS) decoupling capacitor 300 in accordance with some embodiments. NMOS decoupling capacitor 300 is able to achieve similar performance and size reduction as PMOS decoupling capacitor 100. Elements in NMOS decoupling capacitor 300 that are the same as elements in NMOS decoupling capacitor 200 or PMOS decoupling capacitor 100 have a same reference number. In comparison with PMOS decoupling capacitor 100, NMOS decoupling capacitor 300 includes a lightly doped drain (LDD) region 360 between n-well 104 and S/D regions 220 and channel region 230. In some embodiments, NMOS decoupling capacitor 300 is usable in an IO area surrounding a core area of an IC. 10 areas often have a higher operating voltage than core areas. The LDD region 360 helps the NMOS decoupling capacitor 300 maintain a low leakage current despite the higher operating voltage in the IO area.

The LDD region 360 is between the n-well 104 and the S/D regions 220 and the channel region 230. The LDD region 360 includes an n-type dopant. In some embodiments, the n-type dopant includes arsenic, phosphorous, or another suitable n-type dopant. In some embodiments, the LDD region 360 has a different species of n-type dopant than the n-well 104. In some embodiments, the LDD region 360 has a same species of n-type dopant as the n-well 104. The LDD region 360 dopant concentration is less than the concentration of n-type dopants in the n-well 104. In some embodiments, the LDD region 360 is formed using a dosage concentration of n-type dopants ranging from about 1e12 cm$^{-2}$ to about 1e14 cm$^{-2}$. In some instances, if the dopant concentration in the LDD region 360 is too high, a risk of leakage current in NMOS decoupling capacitor 300 increases to an unacceptable level. In some instances, if the dopant concentration in the LDD region 360 is too low, a capacitance of the NMOS decoupling capacitor 300 is reduced to an unacceptable level.

Figure 4:
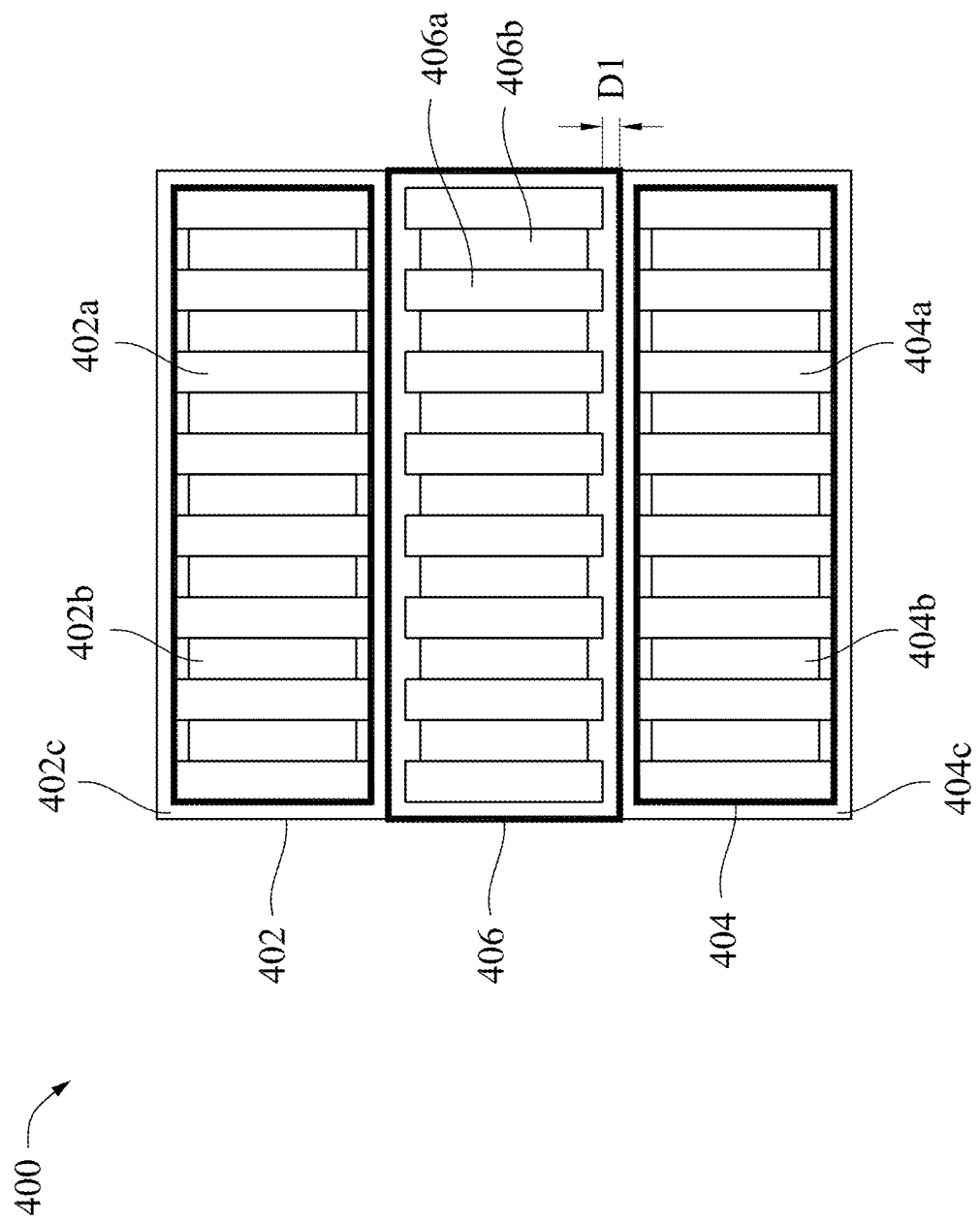
FIG. 4 is a top view of an integrated circuit in accordance with some embodiments.

FIG. 4 is a top view of an integrated circuit (IC) 400 in accordance with some embodiments. The IC 400 includes a first PMOS cell 402 and a second PMOS cell 404. An NMOS decoupling capacitor cell 406 is between the first PMOS cell 402 and the second PMOS cell 404. The NMOS decoupling capacitor cell 406 includes at least one NMOS decoupling capacitor, e.g., NMOS decoupling capacitor 200.

The first PMOS cell 402 includes at least one PMOS device and is configured to implement a function of the IC 400. The first PMOS cell 402 receives a first operating voltage. The first PMOS cell 402 includes a plurality of gate structures 402a extending over a first doped region 402b in a substrate. The first PMOS cell 402 further includes an n-well 402c in the substrate. The n-well 402c surrounds the gate structures 402a in a plan view.

The second PMOS cell 404 includes at least one PMOS device and is configured to implement a function of the IC 400. In some embodiments, the function of first PMOS cell 402 is a same function as second PMOS cell 404. In some embodiments, the function of first PMOS cell 402 is different from the function of second PMOS cell 404. The second PMOS cell 404 receives a second operating voltage. In some embodiments, the second operating voltage is equal to the first operating voltage. In some embodiments, the second operating voltage is different from the first operating voltage. The second PMOS cell 404 includes a plurality of gate structures 404a extending over a second doped region 404b in the substrate. The second PMOS cell 404 further includes an n-well 404c in the substrate. The n-well 404c surrounds the gate structures 404a in a plan view.

NMOS decoupling capacitor cell 406 is between the first PMOS cell 402 and the second PMOS cell 404 and electrically decouples the first PMOS cell 402 from the second PMOS cell 404. NMOS decoupling capacitor cell 406 includes a plurality of gate structures 406a over a third doped region 406b in the substrate. In some embodiments, NMOS decoupling capacitor cell 406 includes an NMOS decoupling capacitor 200. In some embodiments, NMOS decoupling capacitor cell 406 includes an NMOS decoupling capacitor 300. NMOS decoupling capacitor cell 406 abuts first PMOS cell 402 and second PMOS cell 404. In some embodiments, NMOS decoupling capacitor cell 406 is free of an n-well and an LDD region.

Gate structures 406a of NMOS decoupling capacitor cell 406 are spaced from gate structures 404a of the second PMOS cell 404 by a distance D1. The distance D1 is determined based on a technology node size of IC 400. As a technology node of IC 400 decreases, the distance D1 also decreases. Distance D1 is reduced in comparison with other decoupling capacitor structures for a same technology node size due to the low leakage current and high capacitance provided by the structure of NMOS decoupling capacitor 200 or 300.

In other designs where first operating voltage is different from second operating voltage, a large space separates PMOS cells from one another. By decreasing distance D1 in comparison with other structures, an overall size of IC 400 is reduced in comparison with other decoupling capacitor structures, even when the first operating voltage is different from the second operating voltage.

Figure 5:
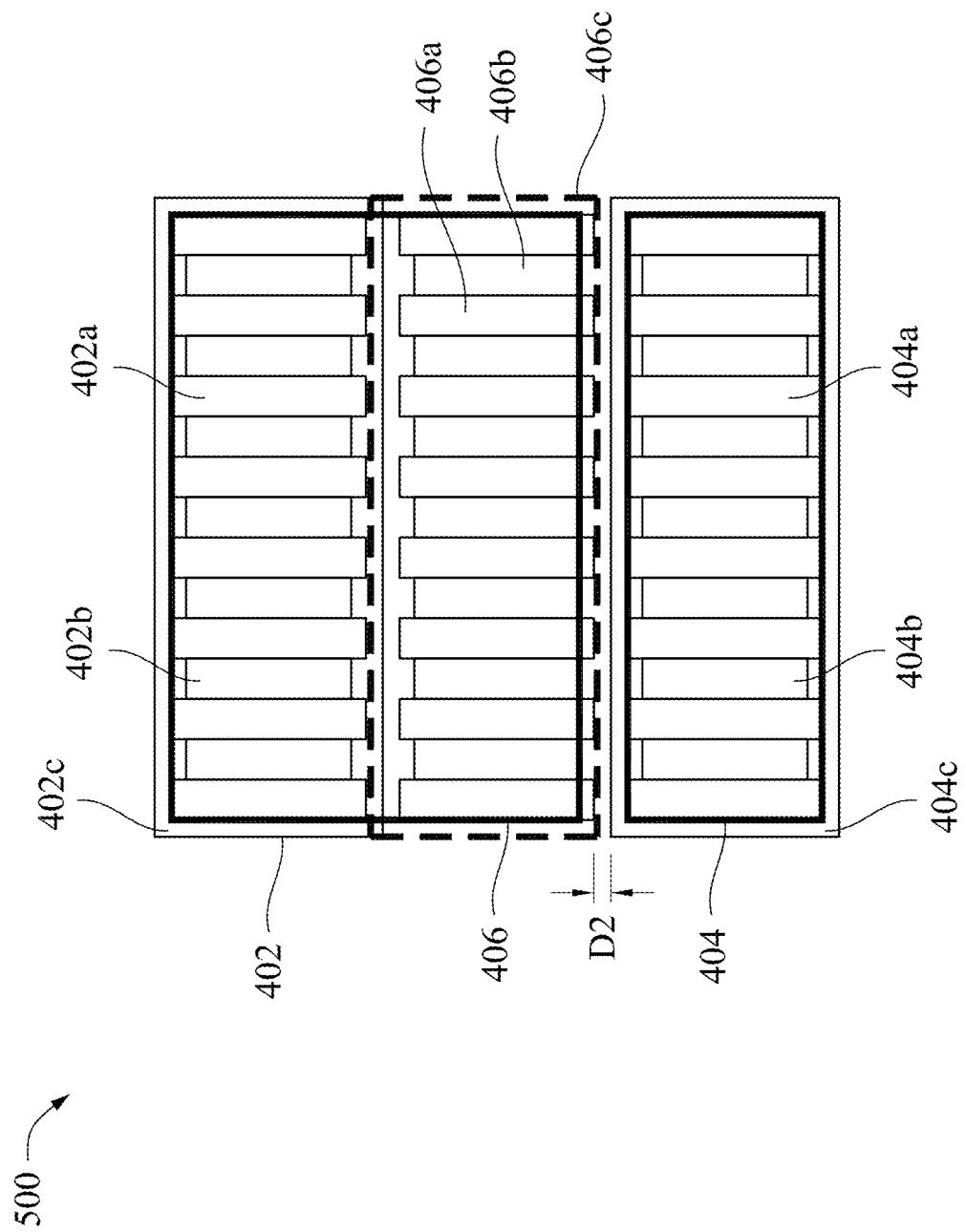
FIG. 5 is a top view of an integrated circuit in accordance with some embodiments.

FIG. 5 is a top view of an integrated circuit (IC) 500 in accordance with some embodiments. Elements in IC 500 that are the same as in IC 400 have a same reference number. In comparison with IC 400, IC 500 includes NMOS decoupling capacitor cell 406 spaced from the second PMOS cell 406. In comparison with IC 400, IC 500 includes a LDD region 406c in NMOS decoupling capacitor cell 406. In some embodiments, LDD region 406c is similar to LDD region 360 (FIG. 3).

In IC 500, gate structures 406a of NMOS decoupling capacitor cell 406 are spaced from gate structures 404a of the second PMOS cell 404 by a distance D2. The distance D2 is determined based on a technology node size of IC 400. As a technology node of IC 400 decreases, the distance D2 also decreases. Distance D2 is reduced in comparison with other decoupling capacitor structures for a same technology node size due to the low leakage current and high capacitance provided by the structure of NMOS decoupling capacitor 200 or 300. In some embodiments, IC 500 is in and IO region of a device.

In other designs where first operating voltage is different from second operating voltage, a large space separates PMOS cells from one another. By decreasing distance D2 in comparison with other structures, an overall size of IC 500 is reduced in comparison with other decoupling capacitor structures, even when the first operating voltage is different from the second operating voltage.

Figure 6:
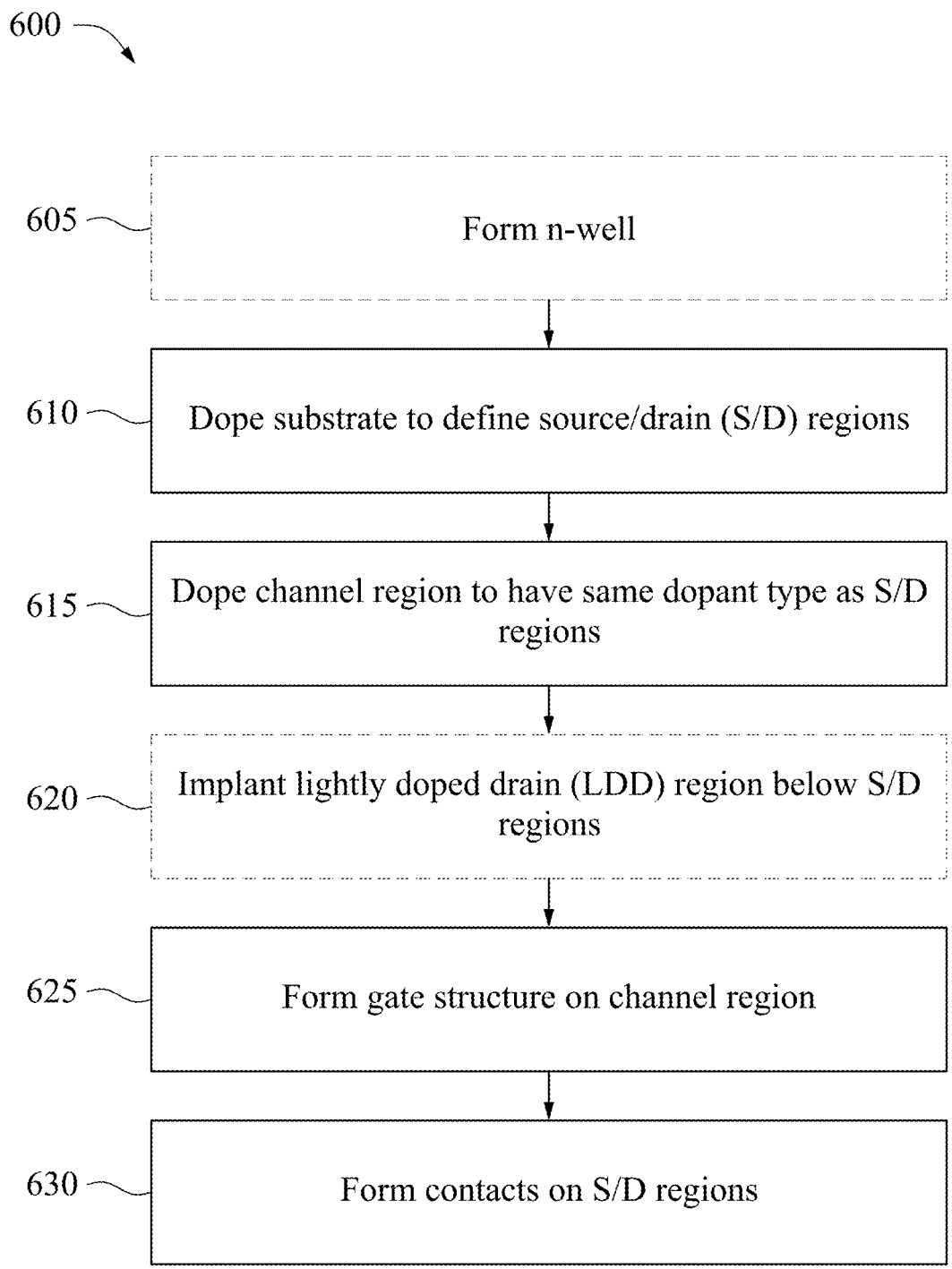
FIG. 6 is a flowchart of a method of making a metal oxide semiconductor (MOS) decoupling capacitor in accordance with some embodiments.

FIG. 6 is a flowchart of a method 600 of making a metal oxide semiconductor (MOS) decoupling capacitor in accordance with some embodiments. FIGS. 7A-7F are perspective views of a MOS decoupling capacitor 700 during various stages of production in accordance with some embodiments. The description of method 600 is provided in combination with the description of MOS decoupling capacitor 700. Elements in MOS decoupling capacitor 700 which are the same as elements in PMOS decoupling capacitor 100, NMOS decoupling capacitor 200 or NMOS decoupling capacitor 300 have a save reference number.

In optional operation 605, an n-well is formed. In some embodiments, the n-well is implanted using an ion implantation process to introduce n-type impurities into the substrate. In some embodiments, the n-well is implanted using a blanket implantation process. In some embodiments, the n-well is implanted using a targeted implantation process. In some embodiments, the n-well is formed using an epitaxial process where the epi-material is doped either following the epitaxial process or in-situ during the epitaxial process. In some embodiments, the n-type dopants include arsenic and/or phosphorous or another suitable material. In some embodiments, optional operation 605 is omitted. In some embodiments, optional operation 605 is omitted when an NMOS decoupling capacitor is formed in a core region of an IC, e.g., NMOS decoupling capacitor 200.

Figure 7A:
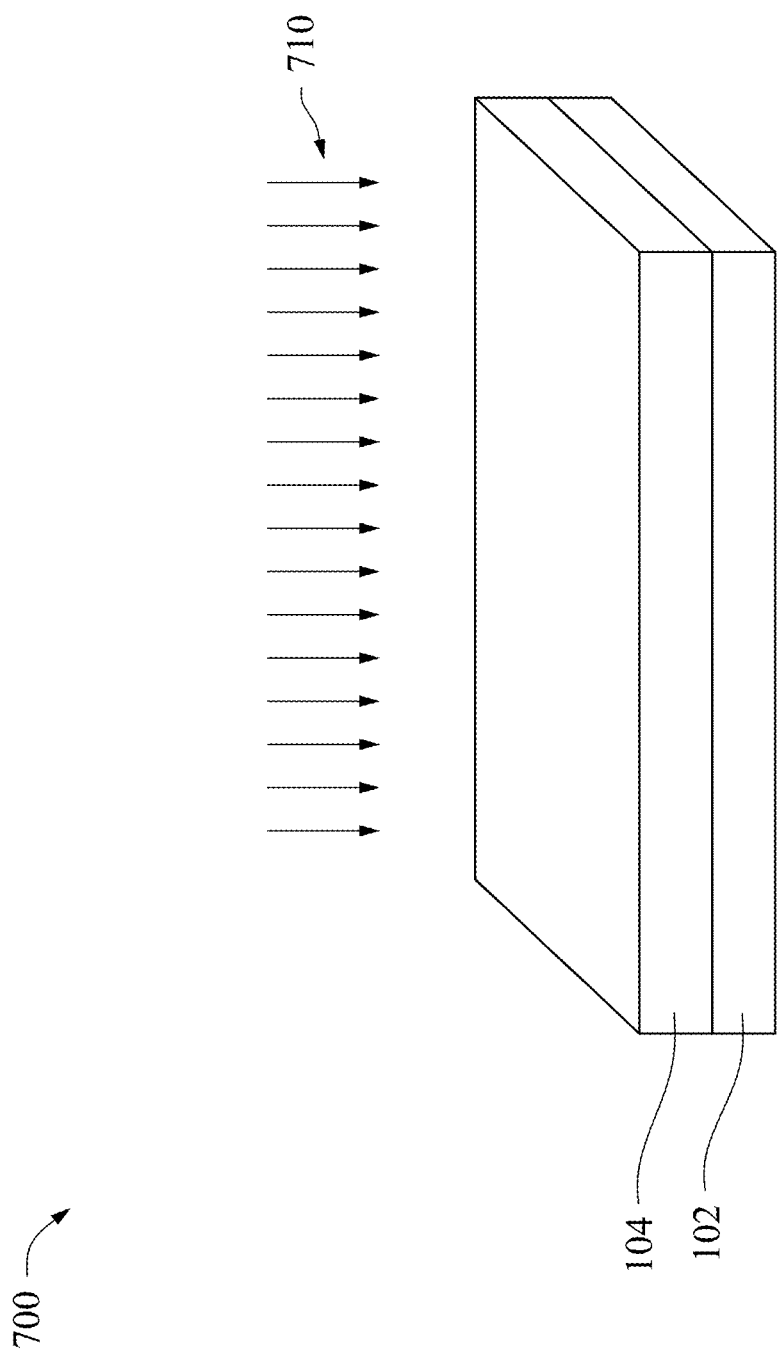
FIGS. 7A-7F are perspective views of a MOS decoupling capacitor during various stages of production in accordance with some embodiments.

FIG. 7A is a perspective view of a MOS decoupling capacitor 700 during operation 605 in accordance with some embodiments. In FIG. 7A, the substrate 102 is subjected to a blank ion implantation process 710 to form n-well 104.

Returning to method 600, in operation 610 the substrate is doped to define S/D regions. In some embodiments that include the n-well, doping the substrate includes doping the n-well. In some embodiments, doping to form the S/D regions includes an in-situ doping process during epitaxial growth of the source and the drain. In some embodiments, doping to form the S/D regions includes an implantation process. In some embodiments, the implantation process is followed by an annealing process. In some embodiments, the implantation is performed on the source in a sequential manner with the implantation process on the drain. In some embodiments, the implantation process is performed on the source and the drain simultaneously. In some embodiments, the implantation process on the source includes implanting a same dopant species as the implantation process on the drain. In some embodiments, the implantation process on the source implants a different dopant species from that implanted in the drain. In some embodiments, a dopant concentration of the source is equal to a dopant concentration of the drain. In some embodiments, the dopant concentration of the source is different from the dopant concentration of the drain. In some embodiments, the dopant type is an N-type dopant, such as phosphorous, arsenic or another suitable n-type dopant. In some embodiments, the dopant type is a P-type dopant, such as boron, indium or another suitable P-type dopant. Species suitable for the dopant type depend on a material being doped. P-type dopants are electron acceptors. In contrast, N-type dopants are electron donors. In some embodiments where n-type dopants are introduced in operation 610, a same dopant species is introduced as in operation 605. In some embodiments where n-type dopants are introduced in operation 610, a different dopant species is introduced from the dopant species in operation 605.

Figure 7B:
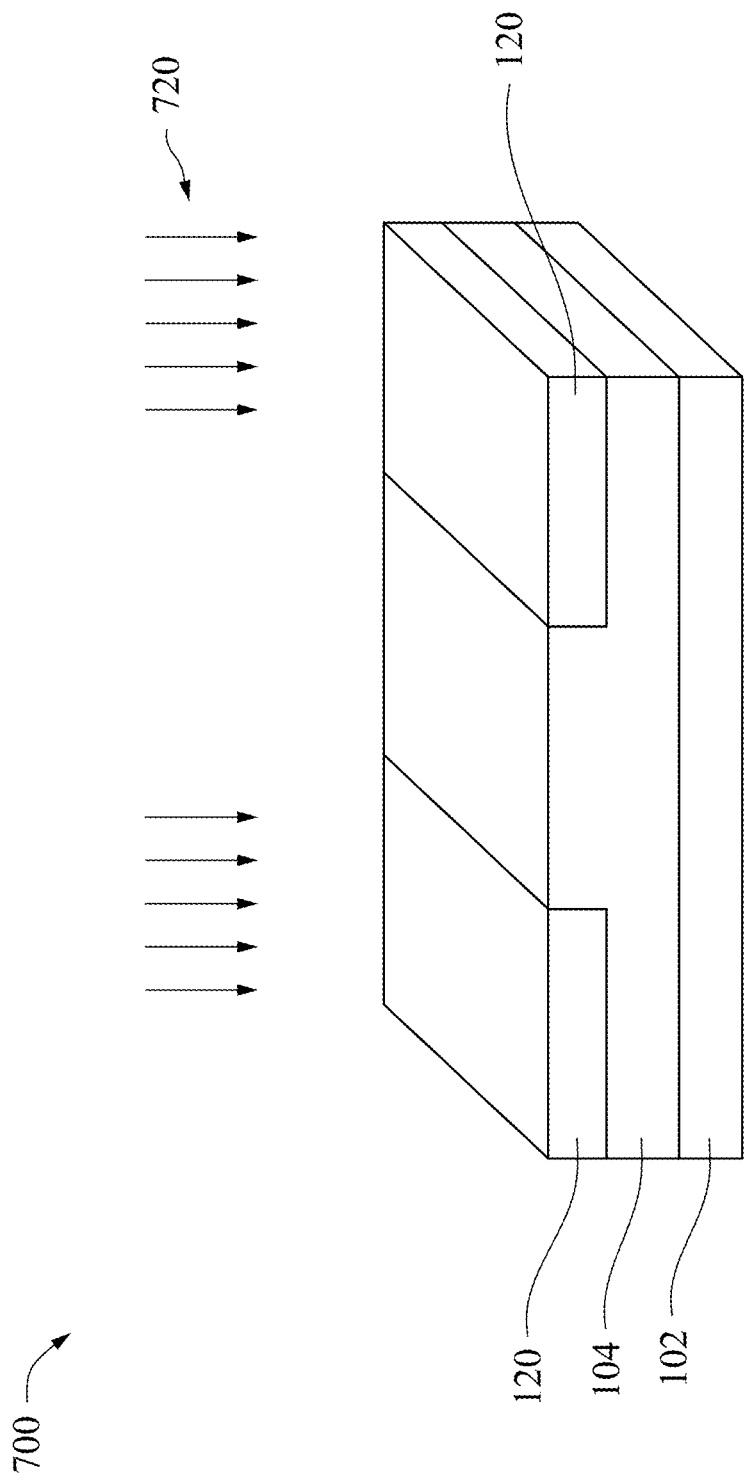

FIG. 7B is a perspective view of a MOS decoupling capacitor 700 during operation 610 in accordance with some embodiments. In FIG. 7B, the n-well 104 is subjected to a targeted ion implantation process 720 to form S/D regions 120.

Returning to method 600, in operation 615 the channel region is doped to have the same dopant type as the S/D regions. In some embodiments that do not include the n-well, the doping includes doping the substrate. In some embodiments that include the n-well, the doping includes doping the n-well. In some embodiments, doping the channel region includes an in-situ doping process during epitaxial growth of the channel region. In some embodiments, doping the channel region includes an implantation process. In some embodiments, the implantation process is followed by an annealing process. In some embodiments, the implantation is performed on the source in a sequential manner with the implantation process on the drain. In some embodiments, the implantation process is performed on the source and the drain simultaneously. In some embodiments, the implantation process on the channel region includes implanting a same dopant species as the S/D regions. In some embodiments, the implantation process on the channel region implants a different dopant species from that implanted in the S/D regions. A dopant concentration of the channel region is less than a dopant concentration of the S/D regions. In some embodiments, the dopant type is an N-type dopant, such as phosphorous, arsenic or another suitable n-type dopant. In some embodiments, the dopant type is a P-type dopant, such as boron, indium or another suitable P-type dopant. Species suitable for the first dopant type depend on a material being doped. P-type dopants are electron acceptors. In contrast, N-type dopants are electron donors. In some embodiments, a concentration of the dopants in the channel region is less than half of the concentration of dopants in the S/D regions. In some embodiments, the concentration of dopants in the channel region ranges from about 5e16 $cm^{-3}$ to about 1e18 $cm^{-3}$.

Figure 7C:
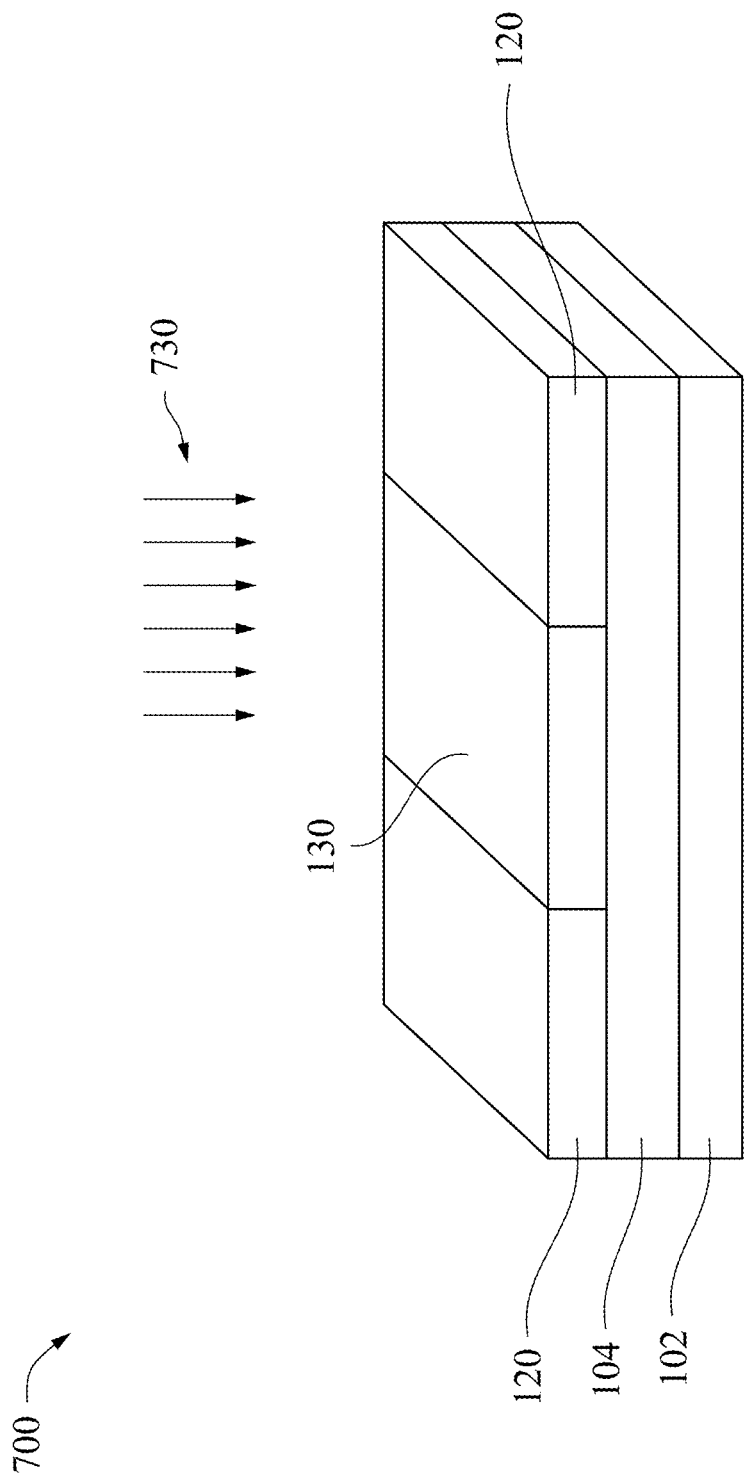

FIG. 7C is a perspective view of a MOS decoupling capacitor 700 during operation 615 in accordance with some embodiments. In FIG. 7C, the n-well 104 is subjected to a targeted ion implantation process 730 to define the channel region 130.

Returning to method 600, in optional operation 620 the substrate is doped to define a LDD region below the S/D regions. In some embodiments that include the n-well, doping the substrate includes doping the n-well. In some embodiments, doping to form the LDD region includes an in-situ doping process during epitaxial growth of the LDD region. In some embodiments, doping to form the LDD region includes an implantation process. In some embodiments, the LDD region is implanted using a blanket implantation process. In some embodiments, the LDD region is implanted using a targeted implantation process. In some embodiments, the implantation process is followed by an annealing process. A dopant concentration of the LDD is less than a dopant concentration of the n-well or the S/D regions. In some embodiments, the dopant type is an N-type dopant, such as phosphorous, arsenic or another suitable n-type dopant. In some embodiments, the dopant type is a P-type dopant, such as boron, indium or another suitable P-type dopant. Species suitable for the dopant type depend on a material being doped. P-type dopants are electron acceptors. In contrast, N-type dopants are electron donors. In some embodiments where n-type dopants are introduced in operation 620, a same dopant species is introduced as in operation 605. In some embodiments where n-type dopants are introduced in operation 620, a different dopant species is introduced from the dopant species in operation 605. In some embodiments, optional operation 620 is omitted. In some embodiments, optional operation 620 is omitted when an NMOS decoupling capacitor is formed in a core region of an IC, e.g., NMOS decoupling capacitor 200.

Figure 7D:
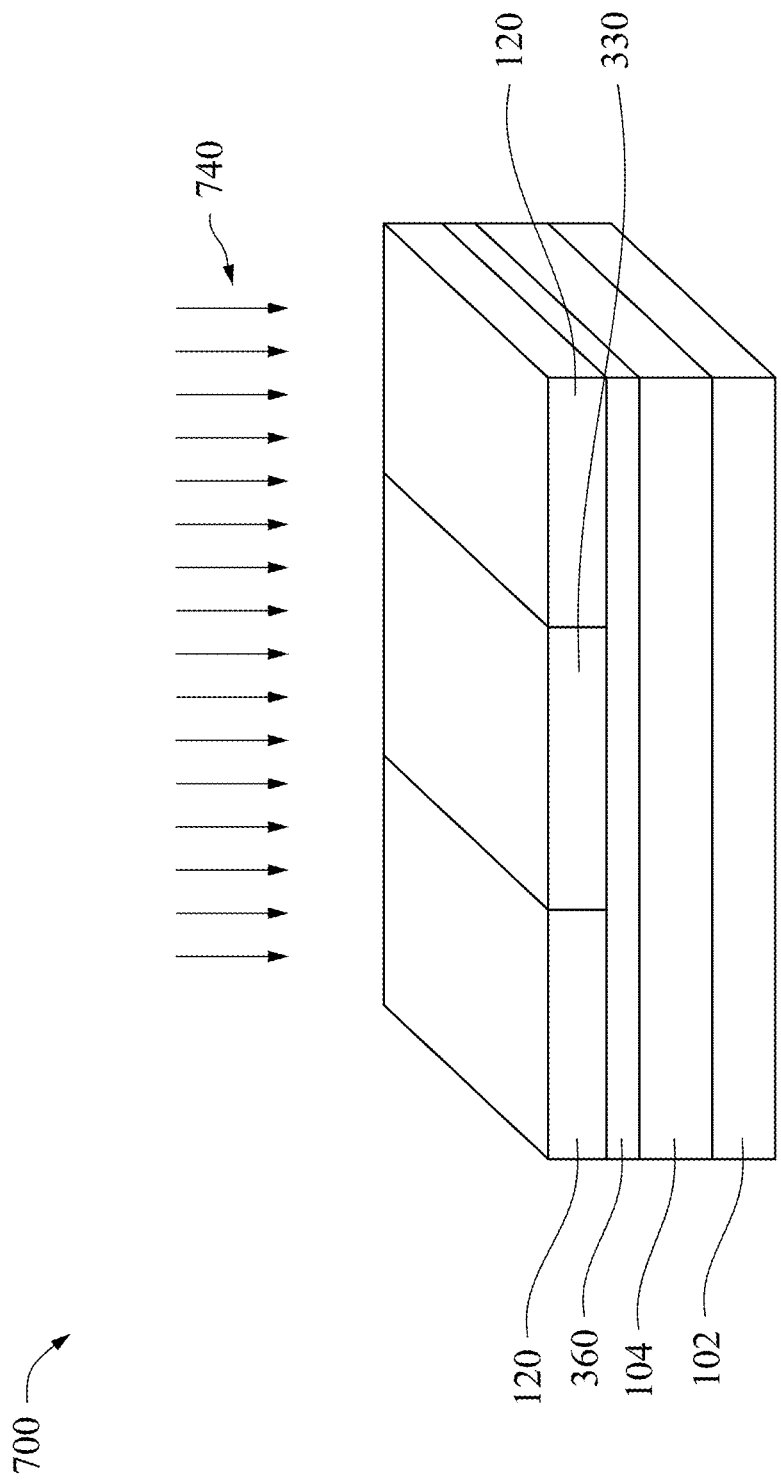

FIG. 7D is a perspective view of a MOS decoupling capacitor 700 during operation 620 in accordance with some embodiments. In FIG. 7D, the n-well 104 is subjected to a blanket ion implantation process 740 to form LDD region 360.

Returning to method 600, in operation 625 a gate structure is formed on the channel region. In operation 625, a gate dielectric layer is deposited and a gate electrode is deposited. A gate dielectric layer is deposited on a substrate. In some embodiments, the gate dielectric layer includes silicon dioxide ($SiO_2$) or silicon oxy nitride (SiON). Some embodiments have gate dielectric layers that are high-k dielectric materials such as HfZrO, $HfSiO_4$, $TiO_2$, $Ta_2O_3$, $ZrO_2$, $ZrSiO_2$, or combinations thereof, or other high-k dielectric materials. In some embodiments, the gate dielectric layer is deposited using chemical vapor deposition (CVD), physical vapor deposition (PVD), atomic layer deposition (ALD), an oxidation process or another suitable process.

A gate electrode material is deposited on the gate dielectric layer. According to some embodiments, the gate electrode material is polysilicon or silicon germanium. Some embodiments have gate electrodes made of other semiconductor materials such as type III-V semiconductors. According to some embodiments, gate electrodes may also include metallization layers or dopants configured to adjust the switching speed of transistors during operation of integrated circuits. In some embodiments, the gate electrode is deposited by CVD, PVD, ALD, plating or another suitable process. In some embodiments, a gate electrode is formed from the gate electrode stack, including the gate electrode material, the gate dielectric layer, and, in some embodiments, a work function layer by: depositing photoresist onto a layer of gate electrode material, patterning the photoresist to leave a mask line over a portion of the gate electrode material that is designated as the gate electrode, and etching the gate electrode stack to expose the source, the drain, and the non-channel portion of the device. In some embodiments, etching the gate electrode is accomplished by performing a plasma etch to selectively remove films of the gate electrode stack from over the substrate.

In some embodiments, a work function layer is deposited over the gate dielectric layer prior to depositing the gate electrode. In some embodiments of an N-type decoupling capacitor, a difference between an effective work function of the work function layer and a valence band energy of the substrate, e.g., the channel region, is equal to or smaller than 10% of the valence band energy. In some embodiments of a P-type decoupling capacitor, a difference between an effective work function of the work function layer and a conduction band energy of the substrate, e.g., the channel region, is equal to or smaller than 10% of the conduction band energy. In some embodiments where the substrate includes a silicon-based material, work function layer is a P-type work function metal such as Pt, Ir, $RuO2$, TiN, MoNx, Ni, Pd, co, TaN, Ru, Mo, W or WNx, or a silicide such as ZrSi2, MoSi2, TaSi2, or NiSi2, or other work function layers, or combinations thereof. In some embodiments, the work function layer is an N-type work function modifying metal such as Ti, Nb, Ag, Au, Al, Co, W, Ni, Ta, TaAl, TaAlC, TaAlN, TaC, TaCN, TaSiN, Mn, Zr, or other N-type work function layer, or combinations thereof. In some embodiments, one subset of decoupling capacitors in an integrated circuit has a P-type work function layer and a second subset of decoupling capacitors in the same integrated circuit have an N-type work function layer. In some embodiments, P-type work function layers are used in conjunction with high-k dielectric materials on P-type decoupling capacitors. In some embodiments, N-type work function layers are used in conjunction with high-k dielectric materials on N-type decoupling capacitors. In embodiments, the work function layer is deposited directly on the gate dielectric layer.

Figure 7E:
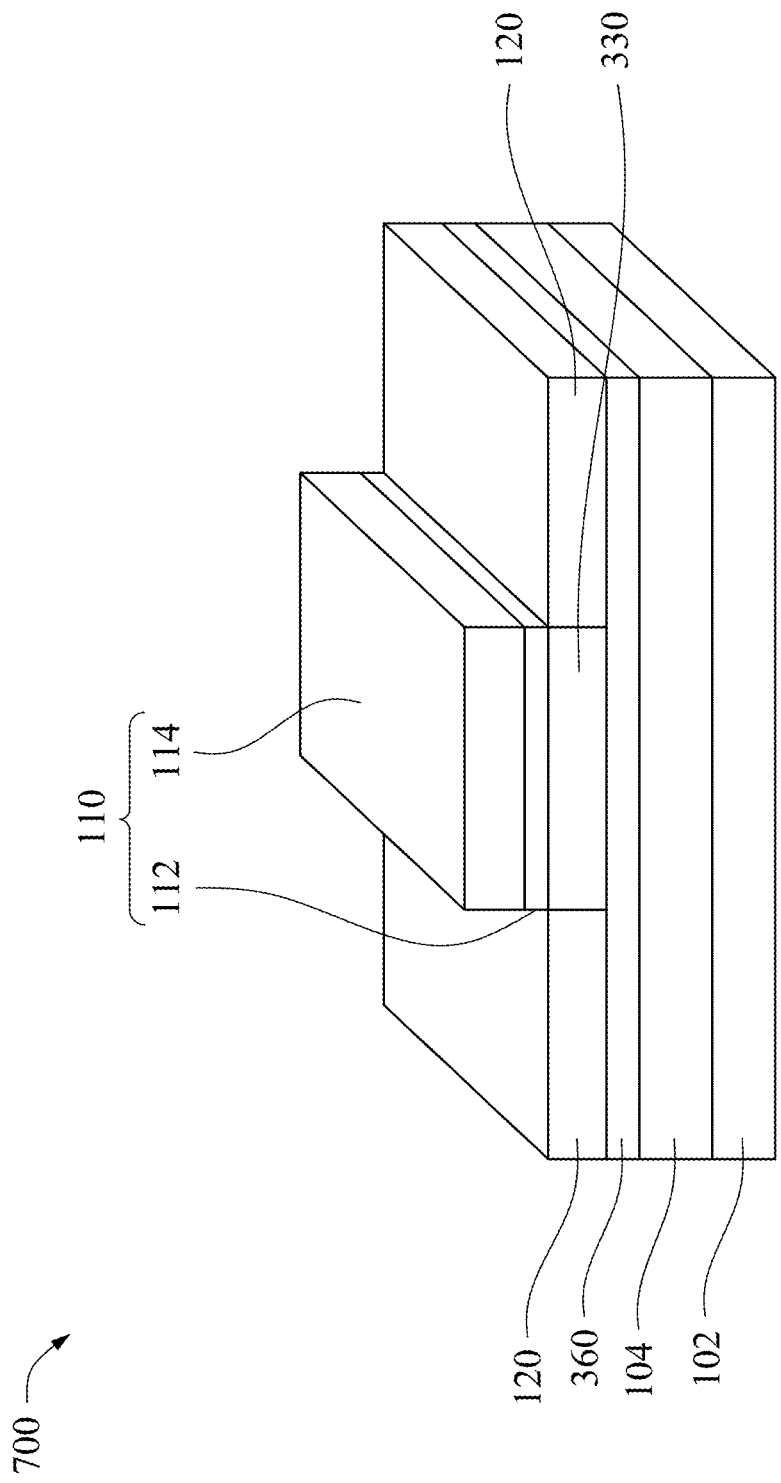

FIG. 7E is a perspective view of a MOS decoupling capacitor 700 following operation 625 in accordance with some embodiments. In FIG. 7E, the gate stack 110 is over the channel region 120.

Returning to method 600, in operation 630 contacts are formed on the S/D regions. According to some embodiments, the contacts include metal layers. In some embodiments, the contacts include cobalt, copper, tungsten, aluminum, combinations of these materials or other suitable materials. In some embodiments, the contacts are deposited by CVD, PVD, ALD, plating or another suitable process. In some embodiments, a silicide layer is formed between the S/D regions and the contacts.

Figure 7F:
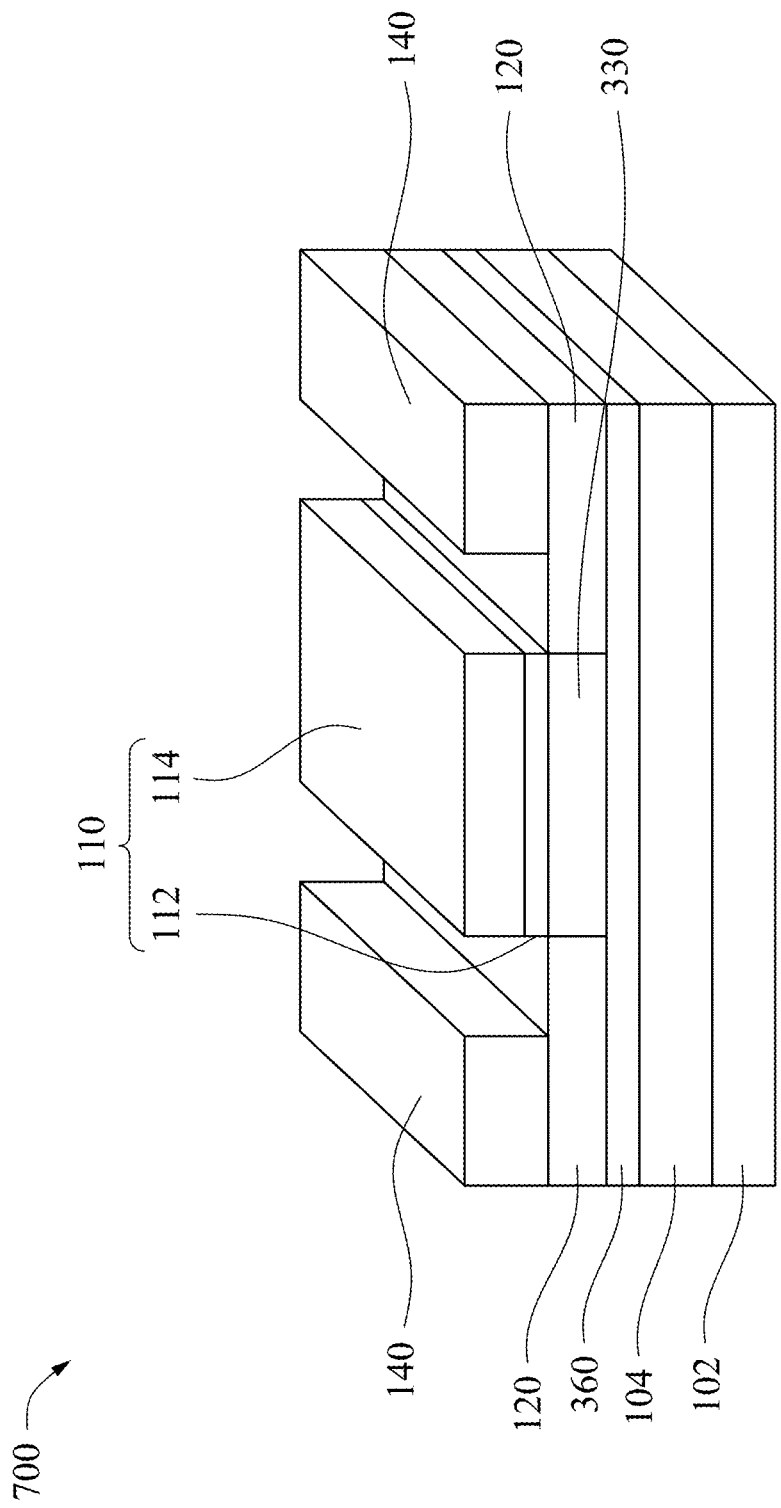

FIG. 7F is a perspective view of a MOS decoupling capacitor 700 following operation 630 in accordance with some embodiments. In FIG. 7F, the contacts 140 are formed over the S/D regions 120.

In some embodiments, additional operations are included in method 600. For example, in some embodiments, an interlayer dielectric (ILD) is formed over the substrate. In some embodiments, at least one operation is omitted from method 600. For example, in some embodiments, operation 605 is omitted as described above. In some embodiments, two or more operations of method 600 are performed simultaneously. For example, in some embodiments, operations 610 and 615 are performed simultaneously. In some embodiments, an order of operations of method 600 is adjusted. For example, in some embodiments, operation 620 is performed prior to operation 610.

An aspect of this description relates to a method. The method includes implanting a first dopant having a first dopant type into a substrate to define a plurality of source/drain (S/D) regions. The method further includes implanting a second dopant having the first dopant type into the substrate to define a channel region between adjacent S/D regions of the plurality of S/D regions, wherein a dopant concentration of the second dopant in the channel region is less than half of a dopant concentration of the first dopant in each of the plurality of S/D regions. The method further includes forming a gate stack over the channel region. The method further includes electrically coupling each of the plurality of S/D regions together. In some embodiments, the method further includes implanting an n-well in the substrate. In some embodiments, the method further includes electrically coupling the n-well to each of the plurality of S/D regions.

An aspect of this description relates to a method. The method includes implanting a first dopant into a substrate to form a plurality of source/drain (S/D) regions in the substrate. The method further includes electrically coupling each of the plurality of S/D regions together. The method further includes implanting a second dopant into the substrate to define a channel region, wherein the channel region is between adjacent S/D regions of the plurality of S/D regions, wherein the second dopant and the first dopant are p-type, and a concentration of the second dopant in the channel region is less than a concentration of the first dopant in each of the plurality of S/D regions. The method further includes forming a gate stack over the channel region. The method further includes forming an n-well in the substrate, wherein the n-well extends under the channel region and the adjacent S/D regions of the plurality of S/D regions. In some embodiments, implanting the second dopant includes implanting the second dopant to a depth less than the implanting of the first dopant. In some embodiments, the method further includes electrically connecting the n-well with each of the plurality of S/D regions. In some embodiments, the method further includes electrically connecting the substrate to a reference voltage. In some embodiments, the method further includes implanting a third dopant to define a lightly doped drain (LDD) region below each of the plurality of S/D regions. In some embodiments, implanting the third dopant includes defining the LDD region continuously extending below each of the plurality of S/D regions. In some embodiments, implanting the second dopant includes defining the LDD region in contact with the channel region. In some embodiments, implanting the third dopant includes implanting the third dopant after implanting the first dopant. In some embodiments, implanting the first dopant includes implanting the first dopant after forming the n-well in the substrate.

An aspect of this description relates to a method. The method includes implanting a first dopant into a substrate to form a plurality of source/drain (S/D) regions in the substrate. The method further includes implanting a second dopant into the substrate to define a channel region, wherein the channel region is between adjacent S/D regions of the plurality of S/D regions, wherein the second dopant and the first dopant are p-type, and a concentration of the second dopant in the channel region is less than a concentration of the first dopant in each of the plurality of S/D regions. The method further includes implanting a third dopant into the substrate to define a lightly doped drain (LDD) region extending continuously under each of the plurality of S/D regions and under the channel region. The method further includes forming a gate stack over the channel region. In some embodiments, the method further includes forming an n-well in the substrate, wherein the n-well extends under the channel region and the adjacent S/D regions of the plurality of S/D regions. In some embodiments, the method further includes electrically connecting each of the plurality of S/D regions to the n-well. In some embodiments, implanting the second dopant includes implanting the second dopant to a depth equal to a depth of the first dopant. In some embodiments, implanting the third dopant includes implanting the third dopant after implanting the second dopant. In some embodiments, forming the gate stack includes forming a gate dielectric layer over the channel region; and forming a gate electrode over the gate dielectric layer. In some embodiments, the method further includes forming a plurality of S/D contacts, wherein each of the plurality of S/D contact is formed over a corresponding S/D region of the plurality of S/D regions. In some embodiments, implanting the first dopants includes implanting the first dopants prior to implanting the second dopants.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    implanting a first dopant having a first dopant type into a substrate to define a plurality of source/drain (S/D) regions;
    implanting a second dopant having the first dopant type into the substrate to define a channel region between adjacent S/D regions of the plurality of S/D regions, wherein a dopant concentration of the second dopant in the channel region is less than half of a dopant concentration of the first dopant in each of the plurality of S/D regions;
    forming a gate stack over the channel region; and
    electrically coupling each of the plurality of S/D regions together.

2. The method of claim 1, further comprising implanting an n-well in the substrate.

3. The method of claim 2, further comprising electrically coupling the n-well to each of the plurality of S/D regions.

4. A method comprising:
    implanting a first dopant into a substrate to form a plurality of source/drain (S/D) regions in the substrate;
    electrically coupling each of the plurality of S/D regions together;
    implanting a second dopant into the substrate to define a channel region, wherein the channel region is between adjacent S/D regions of the plurality of S/D regions, wherein the second dopant and the first dopant are p-type, and a concentration of the second dopant in the channel region is less than a concentration of the first dopant in each of the plurality of S/D regions;
    forming a gate stack over the channel region; and
    forming an n-well in the substrate, wherein the n-well extends under the channel region and the adjacent S/D regions of the plurality of S/D regions.

5. The method of claim 4, wherein implanting the second dopant comprises implanting the second dopant to a depth less than the implanting of the first dopant.

6. The method of claim 4, further comprising electrically connecting the n-well with each of the plurality of S/D regions.

7. The method of claim 4, further comprising electrically connecting the substrate to a reference voltage.

8. The method of claim 4, further comprising implanting a third dopant to define a lightly doped drain (LDD) region below each of the plurality of S/D regions.

9. The method of claim 8, wherein implanting the third dopant comprises defining the LDD region continuously extending below each of the plurality of S/D regions.

10. The method of claim 8, wherein implanting the second dopant comprises defining the LDD region in contact with the channel region.

11. The method of claim 8, wherein implanting the third dopant comprises implanting the third dopant after implanting the first dopant.

12. The method of claim 4, wherein implanting the first dopant comprises implanting the first dopant after forming the n-well in the substrate.

13. A method comprising:
    implanting a first dopant into a substrate to form a plurality of source/drain (S/D) regions in the substrate;
    implanting a second dopant into the substrate to define a channel region, wherein the channel region is between adjacent S/D regions of the plurality of S/D regions, wherein the second dopant and the first dopant are p-type, and a concentration of the second dopant in the channel region is less than a concentration of the first dopant in each of the plurality of S/D regions;
    implanting a third dopant into the substrate to define a lightly doped drain (LDD) region extending continuously under each of the plurality of S/D regions and under the channel region; and
    forming a gate stack over the channel region.

14. The method of claim 13, further comprising forming an n-well in the substrate, wherein the n-well extends under the channel region and the adjacent S/D regions of the plurality of S/D regions.

15. The method of claim 14, further comprising electrically connecting each of the plurality of S/D regions to the n-well.

16. The method of claim 13, wherein implanting the second dopant comprises implanting the second dopant to a depth equal to a depth of the first dopant.

17. The method of claim 13, wherein implanting the third dopant comprises implanting the third dopant after implanting the second dopant.

18. The method of claim 13, wherein forming the gate stack comprises:
    forming a gate dielectric layer over the channel region; and
    forming a gate electrode over the gate dielectric layer.

19. The method of claim 13, further comprising forming a plurality of S/D contacts, wherein each of the plurality of S/D contact is formed over a corresponding S/D region of the plurality of S/D regions.

20. The method of claim 13, wherein implanting the first dopants comprises implanting the first dopants prior to implanting the second dopants.

* * * * *